United States Patent
Kliewer et al.

(10) Patent No.: US 7,428,673 B2
(45) Date of Patent: Sep. 23, 2008

(54) TEST METHOD FOR DETERMINING THE WIRE CONFIGURATION FOR CIRCUIT CARRIERS WITH COMPONENTS ARRANGED THEREON

(75) Inventors: Jörg Kliewer, München (DE); Martin Versen, Feldkirchen/Westham (DE)

(73) Assignee: Infineon Technologies AG, Munich (DE)

(*) Notice: Subject to any disclaimer, the term of this patent is extended or adjusted under 35 U.S.C. 154(b) by 166 days.

(21) Appl. No.: 11/214,482

(22) Filed: Aug. 29, 2005

(65) Prior Publication Data

US 2006/0053354 A1   Mar. 9, 2006

(30) Foreign Application Priority Data

Aug. 27, 2004   (DE) ............... 10 2004 041 553

(51) Int. Cl.
*G11C 29/00* (2006.01)
*G01R 31/28* (2006.01)

(52) U.S. Cl. .................. 714/718; 714/723; 714/738; 714/736

(58) Field of Classification Search .............. None
See application file for complete search history.

(56) References Cited

U.S. PATENT DOCUMENTS

| 6,208,571 | B1 | 3/2001 | Ikeda et al. |
|---|---|---|---|
| 6,345,372 | B1 | 2/2002 | Dieckmann et al. |
| 6,836,440 | B2 | 12/2004 | Adler et al. |
| 6,925,408 | B2 * | 8/2005 | Premy et al. ............ 702/120 |
| 2003/0169633 | A1 | 9/2003 | Adler et al. |
| 2004/0136249 | A1 | 7/2004 | Stocken et al. |

FOREIGN PATENT DOCUMENTS

| DE | 100 05 161 A1 | 11/2000 |
|---|---|---|
| DE | 102 03 570 A1 | 8/2003 |
| DE | 102 58 199 A1 | 7/2004 |

OTHER PUBLICATIONS

Biewenga et al., "Static Component Interconnect Test Technology (SCITT), A New Technology for Assembly Testing", ITC International Test Conference, 1999, pp. 439-448, (10 pages).

* cited by examiner

*Primary Examiner*—Phung M. Chung
(74) *Attorney, Agent, or Firm*—Maginot Moore & Beck

(57) ABSTRACT

The invention relates to a test method for determining a wire configuration for a circuit carrier having at least one component arranged thereon, where internal lines in the component are connected to component connections in a prescribed order, and where the component connections are wired to connections on the circuit carrier. According to the method, a respective prescribed test signal is applied to each internal line of the component using a controllable test signal generator integrated in the component. Output signals applied to the connections of the circuit carrier are tapped off. Thereafter, the respective output signals tapped off are identified with the corresponding test signals applied to the internal lines of the component using an external test apparatus for determining the wire configuration between the component connections and circuit carrier connections.

18 Claims, 4 Drawing Sheets

TEST METHOD FOR DETERMINING THE WIRE CONFIGURATION FOR CIRCUIT CARRIERS WITH COMPONENTS ARRANGED THEREON

BACKGROUND

The invention relates to a test method for determining the wire configuration for a circuit carrier having at least one component arranged thereon, with connections of the component being wired to connections of the circuit carrier. The invention also relates to a memory module test system for carrying out the method on memory modules having memory chips arranged thereon.

Electronic components or integrated circuits, such as memory chips, are normally accommodated on circuit carriers, such as circuit boards or modules, which can then be used flexibly, for example in PCs, and have standardized connections.

In particular, memory modules having memory chips are known. Before memory modules are delivered, however, the functionality of the components or memory chips used needs to be checked by tests during production. Such memory tests involve address and data sequences being written and read by a memory tester, which allows errors to be identified within the chips. By way of example, electrical coupling between data or word lines is identified by writing appropriate data patterns and subsequently reading them using the memory tester.

FIG. 1 shows an example of a memory chip 1 which has a memory cell array 2 with word and bit lines 3, 4. The bit lines or data lines 4 are driven by cell array amplifiers 5. By way of example, FIG. 1 shows four bit lines 4-1, 4-2, 4-3, 4-4, which are routed to connections 6-1, 6-2, 6-3, 6-4 of the memory chip.

These bit lines or data lines are used for inputting and outputting data. The read/write access operations to such a memory chip are controlled by further control signals, which are input at further connections 7, 8, 9 of the memory chip 1. During the manufacture of the memory chips 1, the association between the data lines 4 and the data connections of the memory chips 6-1, 6-2, 6-3, 6-4 is known. This is necessary in order to write particular test patterns to the memory cell array.

FIG. 2 shows an example of a memory module 10 with four memory chips 11, 12, 13, 14 which each have data connections 15, 16, 17, 18 which are wired to data connections 19, 20, 21, 22 of the memory module 10. Often the exact wire configuration is unknown, which is shown by the blocks 23, 24, 25, which are caused by unknown transposition or unknown scrambling of the wire configuration. In order to write particular test patterns to the appropriate memory cell arrays in order to test the memory chips 11, 12, 13, 14 which are used on the memory module 10, however, exact knowledge of the wire configuration between the data connections of the memory chips 11, 12, 13, 14 and the data connections 19, 20, 21, 22 of the module 10 is required. If the documentation about this wire configuration is incorrect or entirely unknown, for example, then it is not possible to actuate adjacent data or bit lines specifically, which is necessary for tests which check coupling between memory cells.

For operation of the memory module, it is not necessary to have exact knowledge of the position of the data lines in the respective memory chips 11, 12, 13, 14, since the position of the memory cells is of no significance for storing and reading. In order to test the functionality of the memory module 10 and hence also to check coupling, for example, between data lines in the memory chips 11, 12, 13, 14 which are used, however, the internal data lines of the memory chips 11, 12, 13, 14 need to be a able to be actuated specifically, i.e. the wire configuration between the memory chip connections 15, 16, 17, 18 and the module connections 19, 20, 21, 22 needs to be known. This is because only then is it possible to apply appropriate test patterns for the memory cell arrays.

SUMMARY

It would therefore be advantageous to provide a test method for determining the wire configuration of circuit carriers having components arranged thereon which is particularly suitable for associating data connections of memory modules with appropriate internal data lines of memory chips arranged on the memory module.

A test method for determining a wire configuration for a circuit carrier having at least one component arranged thereon is provided, where internal lines in the component are connected to component connections in a prescribed order, and where the component connections are wired to connections on the circuit carrier. In one embodiment, the method includes the following method steps:

(a) a respective prescribed test signal is applied to each internal line of the component using a controllable test signal generator integrated in the component;
(b) output signals applied to the connections of the circuit carrier are tapped off; and
(c) the respective output signals tapped off are identified with the corresponding test signals applied to the internal lines of the component using an external test apparatus for determining the wire configuration between the component connections and circuit carrier connections.

One basic idea of the invention is essentially for a test signal generator to use the internal lines of the component to deliver signals, inside the chip, to the connections of the component, which are routed to an external test apparatus via the component's wiring to the circuit carrier or the circuit carrier connections. This external test apparatus uses the known stipulations for the internally generated test signals to evaluate the corresponding output signals on the component connections and thus identifies a corresponding component connection for each circuit carrier connection, and hence the internal lines of the component, which may be data lines, for example.

In one preferred embodiment of the test method, each component connection has an associated predetermined test signal level, and each output signal level tapped off from a circuit carrier connection which is the same as the test signal level is assigned a corresponding component connection. The advantage of a number of test signal levels which is identical to the number of wire configurations to be determined is that only one method pass is necessary in order to make the association between the circuit carrier connections and their component connections.

In one preferred development of the inventive method, the component has first and second internal lines which are connected to first and second connections of the component in a prescribed order. In addition, the internal test signal generator is actuated for the purpose of applying internal test signals to the first internal lines using the second internal lines. The first and second connections of the component are wired to first and second connections of the circuit carrier.

In this arrangement, the following method steps are provided:

(i) the test signal generator is activated by means of control signals applied to the second connections of the circuit carrier, (ii) a respective prescribed internal test signal is applied to each of the first internal lines, (iii) the corresponding output signals are tapped off from the first connections of the circuit carrier, and (iv) the wire configuration between the first component connections and the first circuit carrier connections is determined by identifying the tapped-off output signals with the corresponding test signals applied to the first internal lines.

Advantageously, the component is a memory chip and the circuit carrier is a memory module. In that case, by way of example, the first internal lines are data or bit lines associated with a word line. An external memory test apparatus is preferably coupled to the memory module via memory module connections and taps off the output signals, evaluates them and controls the internal test signal generator.

In one development of the inventive test method, applying the internal test signals writes prescribed test data to the memory chip, the test signal generator is deactivated before the output signals are tapped off, and the tapping-off of the output signals by the memory test apparatus reads the test data which have been read in. In this case, the memory test apparatus determines the wire configuration by comparing the read data with the prescribed test data.

Since test signal generators themselves are frequently provided in memory chips in order to check the functionality of the chip itself, this development is particularly suitable for also determining the wire configuration of the memory chip with the memory module. The inventive combination of the internal test pattern or test data generation by the test signal generator and the reading of the data by an external memory test apparatus makes it a simple matter to associate the memory module connections with the internal data or bit lines of the chip.

In one variant of the test method, the method steps are repeated cyclically with different test data, each test cycle involving a first logic level being applied to a respective one of the internal data lines and a second logic level being applied to the remaining internal data lines. In this way, a respective external memory module connection is associated with each internal data line. By way of example, a respective logic high level can be successively applied to each data line, i.e. per test cycle, which is equivalent to writing a bit, and subsequently read using the external memory test apparatus. In this way, a respective wire configuration between an internal data line and an external memory module connection is identified per test cycle.

In one preferred development, the test signal generator is an ACTM test pattern generator which can be programmed using the second internal lines. ACTM test pattern generators are already used for the memory chip test in DDR1 or DDR2 memory chips and can advantageously be programmed using address and control lines. In line with the invention, these test pattern generators are additionally used to detect the wire configuration of the memory modules.

In one embodiment, the invention also provides a test system for memory modules having:

(a) a memory module with external memory module connections;

(b) at least one memory chip, arranged on the memory module, with memory chip data connections and memory chip control connections to which internal data lines and internal control lines in the memory chip are connected in a prescribed order, where the memory chip has an integrated controllable test signal generator which is connected to the internal memory chip data lines for the purpose of applying test signals and is connected to the internal control lines for the purpose of accepting and outputting control signals, the memory chip data connections being wired to module data connections and the memory chip control connections being wired to module control connections, and having (c) an external memory test apparatus, which is coupled to the module connections, for applying control signals to the module control connections and for tapping off output signals from the module data connections, where (d) in a first test phase the external memory test apparatus couples control signals for activating the test signal generator to the module control connections, (e) in a second test phase the internal test signal generator couples prescribed test signals to the memory chip data lines for the purpose of writing test data to the memory chip, and then the external memory test apparatus couples control signals for deactivating the test signal generator to the module control connections, and where (f) in a third test phase the memory test apparatus uses the module control connections and module data connections to read the written test data as output signals at the module data connections and compares the read data with the prescribed data written by the test signal generator in order to ascertain the wire configuration between the memory chip connections and the module data connections.

In this case, the test data are advantageously stipulated or prescribed by programming the test signal generator during the actual production of the memory chip and are known to the external test apparatus. This has the advantage that standardized test data, for example a respective set bit for one of the data lines and otherwise unset bits, allow rapid evaluation of the output signals. Another advantage is that the memory chip can be switched to a particular test mode via its control connections, which accept address and control signals, for example, by virtue of the test pattern generator generating control signals. The inventive idea of using the already available test pattern generator in the memory chip to write data to the memory cells in the chip but subsequently, in a reading step or the third test phase, to read these data externally using the memory test apparatus thus allows rapid and simple identification of the module data connections with the memory chip data connections.

Next, the ascertained wire configuration can advantageously be taken into account to perform a memory test on the memory cell array in the memory chip. To this end, as already mentioned at the outset, it is also necessary to consider the physical arrangement of the data lines. However, the invention provides this very association and allows the specific actuation of, by way of example, adjacent bit or data lines in the memory chip.

BRIEF DESCRIPTION OF THE DRAWINGS

Further refinements and advantages of the invention are explained below with reference to the exemplary embodiment and to the figures, in which.

In the figures, unless stated otherwise, elements which are the same or have the same function have been provided with identical reference symbols.

DESCRIPTION

Figure 1:
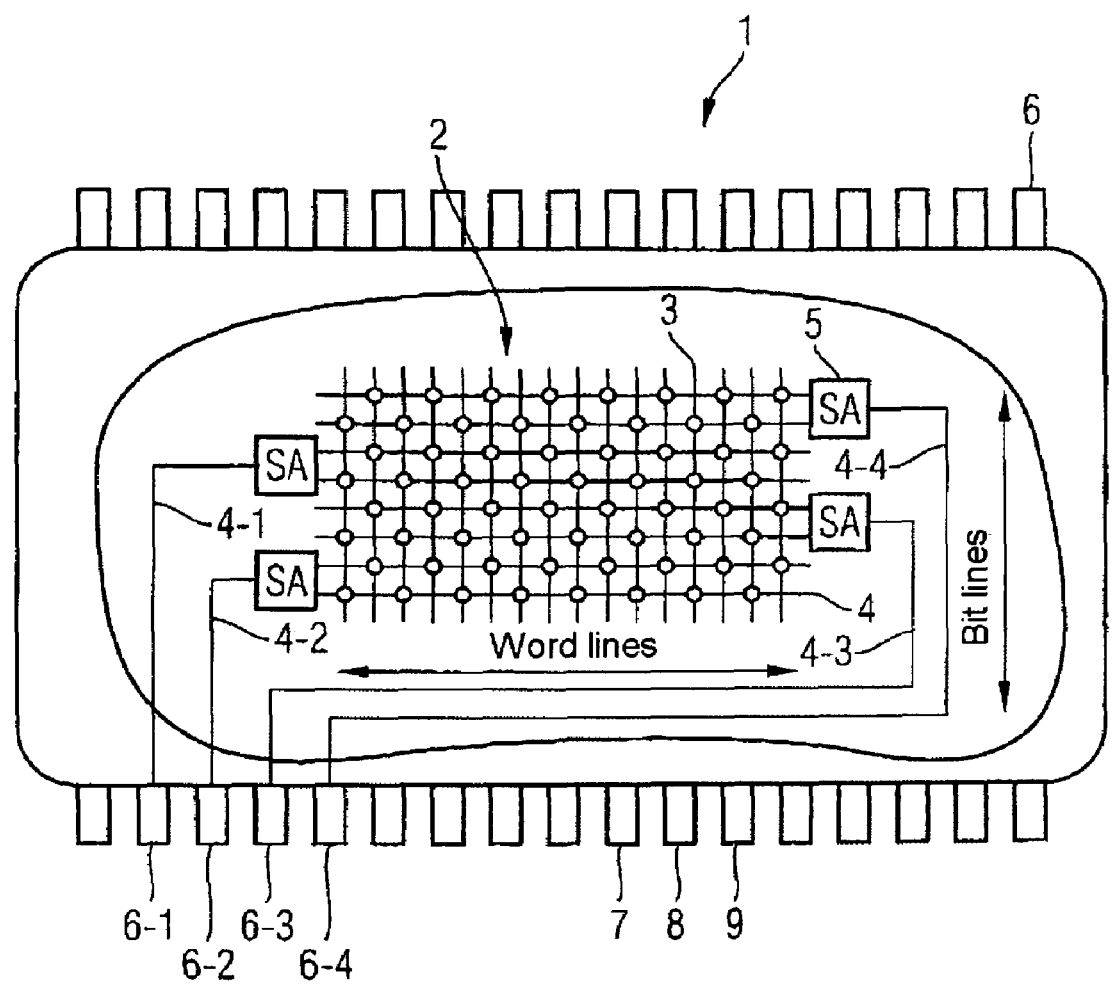
FIG. 1 shows a memory chip based on the prior art.
Figure 2:
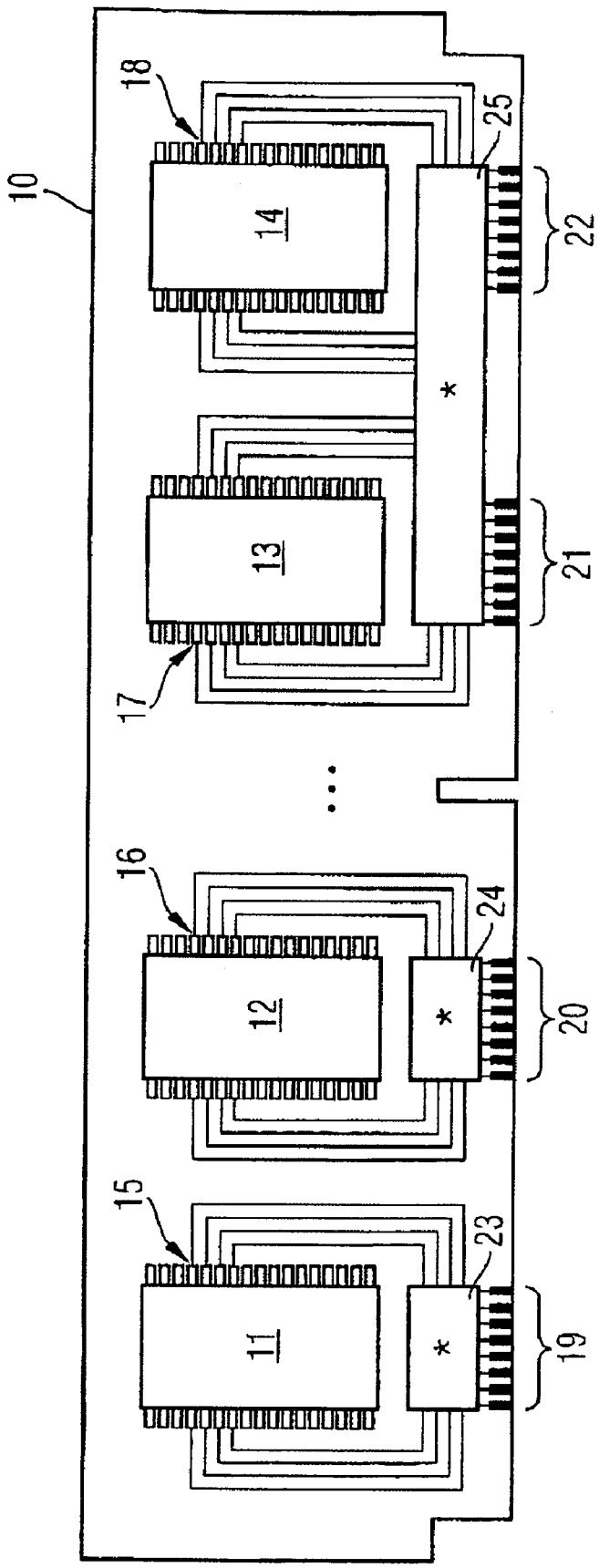
FIG. 2 shows a memory module based on the prior art.
Figure 3:
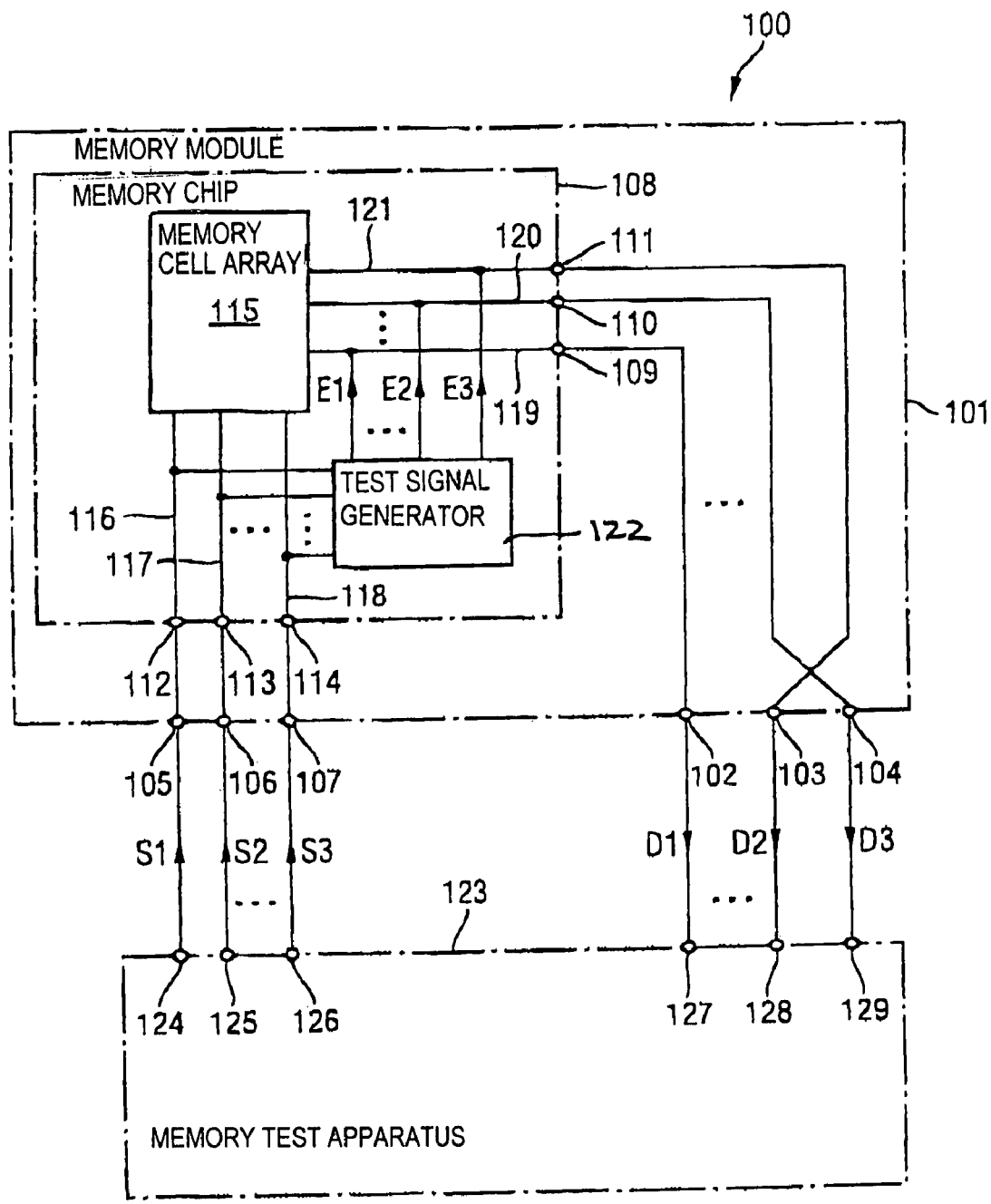
FIG. 3 shows a block diagram of a memory module test system based on the invention.

FIG. 3 shows a test system or memory module test system 100. In this case, a circuit carrier or memory module 101 has first connections 102, 103, 104 and second connections 105, 106, 107. The first connections 102, 103, 104 are memory module data connections here and the second connections 105, 106, 107 are memory module control connections.

The memory module 101 holds a component or memory chip 108 having first component connections or memory chip data connections 109, 110, 111 and second chip connections or memory chip control connections 112, 113, 114. The memory chip connections 109-114 are wired to memory module connections 102-107. Particularly the wire configuration between the memory module data connections 102, 103, 104 and the memory chip data connections 109, 110, 111 is frequently unknown on account of a lack of documentation for the memory module 101.

The memory chip 108 has a memory cell array 115 to which internal control and address lines 116, 117, 118 and internal data lines 119, 120, 121 are routed. In this case, the internal data lines 119, 120, 121 correspond to bit lines and the internal control and address lines 116, 117, 118 also correspond to word lines, for example. In addition, the memory cell array 115 has decoding devices and cell array amplifiers (not shown here) for actuating individual memory cells, as are known from the prior art.

The memory chip has a controllable test signal generator 122 which is coupled to the internal data lines 119, 120, 121 and to the internal control lines 116, 117, 118.

The memory module 101 has a memory test apparatus 123 coupled to it which, for the purpose of carrying out the inventive test method, delivers control signals S1, S2, S3 to first outputs 124, 125, 126 for the purpose of input to the module control connections 105, 106, 107. At input connections 127, 128, 129, the memory test apparatus 123 reads data D1, D2, D3 from the memory module 101 or from the memory cell array 115 of the memory chip 108. The connections 124-129 of the memory test apparatus 123 are in bidirectional form, in principle.

Figure 4:
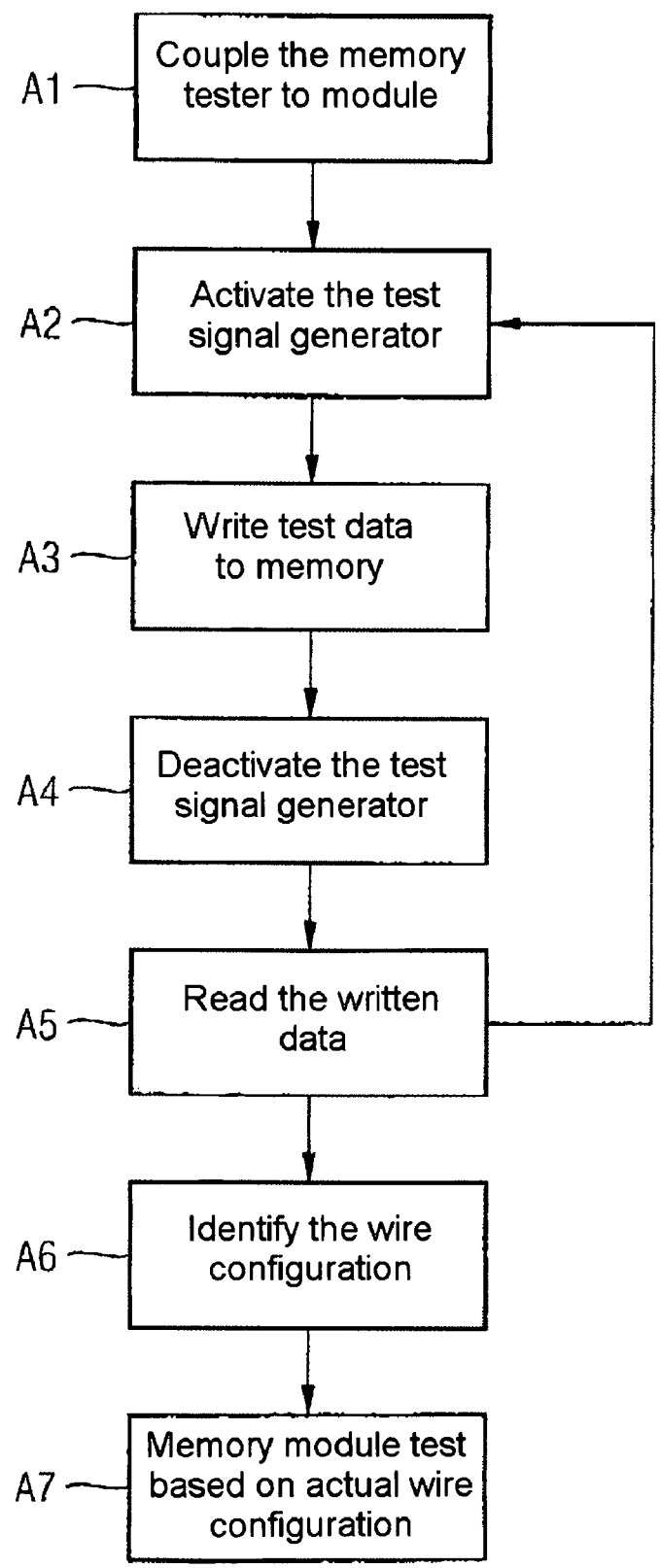
FIG. 4 shows a flow chart of the inventive test method.

The operation and performance of the method for determining the wire configuration between the memory chip data connections and the module data connections are explained below with reference to FIG. 4.

First, the memory module 101 and the memory tester or memory test apparatus 123 are coupled to one another by means of lines (step A1). Using particular control or programming sequences, the memory test apparatus 123 uses control signals S1, S2, S3 to activate the test signal generator 122 in the first test phase A2.

In the second test phase A3, the internal test signal generator 122 writes prescribed test data E1, E2, E3 to the memory cell array 115 of the memory chip 108. This is done by virtue of the test signal generator 122 delivering address and control signals to the internal address and control lines 116, 117, 118 of the memory chip 108 and appropriate test signals E1, E2, E3 to the data lines 119, 120, 121. By way of example, the application of a first logic level or high level to the third data line 121 and second logic levels or low levels allow test signals to be generated which are based on a pattern E1=0, E2=0, E3=1 and are stored in appropriate fashion in memory cells of the memory cell array 115. By way of example, the test pattern has been programmed into the test signal generator 122 at the start of the test mode, or else has been stipulated during the actual production of the memory chip 108.

In step A4, the memory test apparatus 122 uses appropriate control signals S1, S2, S3 to deactivate the test signal generator 122 again. The data or test data E1, E2, E3 which have been written remain in the memory cell array 115 of the memory chip 108.

In a third test phase A5, the memory tester 123 now uses address or control signals S1, S2, S3 which have been input to the memory chip 108 to read the test data which have been written, in regular fashion. In this case, the memory test apparatus 123 knows which test pattern, in this case E1=0, E2=0, E3=1, has been written to the internal chip data lines 119, 120, 121. If the wire configuration between the memory module data connections 102, 103, 104 and the memory chip connections 109, 110, 111 has transposed these connections, this is now identified by the memory test apparatus 123. In the example chosen here, the second and third data lines 120, 121 of the memory chip 108 are routed to the module data connections 103, 104 the other way around by the wire configuration. The memory test apparatus 123 thus reads an output data pattern D1=0, D2=1, D3=0. Hence, by writing a set bit to the memory cell determined by the third internal bit line 121 in the memory cell array 115 and subsequently reading it using the memory test apparatus 123, it has been identified that the third memory module data connection 104 does not actuate the third internal data line 121, but rather the second memory module connection 103 is routed to the third internal data line 121.

In a further test cycle, the test signal generator 122 is repeatedly activated, and now writes a test pattern, such as E1=0, E2=1, E3=0, to the memory cell array, is subsequently deactivated, and then the memory test apparatus 123 reads a data pattern D1=0, D2=0, D3=1. This cycle A2-A5 is repeated until the respective memory chip data connection 109, 110, 111 or the respective internal data line 119, 120, 121 can be associated with all module data connections 102, 103, 104. Hence, in step A6, the complete wire configuration between module data connections 102, 103, 104 and memory chip data connections 109, 110, 111 is identified and determined.

With the inclusion of the correct wire configuration, in a fourth test phase A7 the memory tester or the memory test apparatus 123 can correctly perform a memory test on the memory cell array 115. In particular, by determining the wire configuration, it is also possible for, by way of example, adjacent memory cells associated with a word line to be actuated specifically and for memory tests to be used to check for coupling, for example. The invention's separate writing of test pattern data by the internal test signal generator 122 and separate reading of the written data by the memory test apparatus 123 thus allows reliable testing of memory modules 101, even where there is insufficient documentation or an unknown wire configuration. This is possible, in particular, because the test signal sequence or the test patterns to be written can either be programmed into the test signal generator 122 by the memory test apparatus 123 itself or else is standardized and stipulated as defined during actual production.

The invention claimed is:

1. A method of determining a connection configuration for a circuit carrier including at least one component arranged on the circuit carrier, the at least one component including internal lines connected to component connections in a prescribed order, and the component connections connected to external circuit carrier connections on the circuit carrier, the method comprising:
    (a) applying prescribed test signals to the internal lines of the component using a controllable test signal generator integrated in the component;
    (b) obtaining output signals from the external circuit carrier connections; and
    (c) identifying the respective output signals with the corresponding test signals applied to the internal lines of the component using an external test apparatus for determining a mapping between the component connections and the external circuit carrier connections by means of the connection configuration.

2. The method of claim 1 wherein each of the component connections is associated with a predetermined test signal level, and wherein each output signal obtained from the external circuit carrier connections which is the same as the predetermined test signal level is assigned a corresponding component connection.

3. The method of claim 1, wherein the internal lines in the component comprise a first set of internal lines and wherein the at least one component further includes a second set of internal lines, wherein the component connections comprise a first set of component connections and wherein the at least one component further includes a second set of component connections, the first set of internal lines connected to the first set of connections in a prescribed order and the second set of internal lines connected to the second set of connections in a prescribed order;

wherein the internal test signal generator is controlled by the external test apparatus in order to apply the internal test signals to the first set of internal lines;

wherein the external circuit carrier connections comprise a first set of external circuit carrier connections and wherein the circuit carrier further comprises a second set of external circuit carrier connections, the first set of component connections connected to the first set of external circuit carrier connections and the second set of component connections connected to the second set of external circuit carrier connections;

wherein the test signal generator is activated by control signals applied to the second set of external circuit carrier connections;

wherein one of the prescribed test signals is applied to each line of the first set of internal lines;

wherein the corresponding output signals are obtained from the first set of external circuit carrier connections, and wherein the connection configuration between the first set of component connections and the first set of circuit carrier connections is determined by identifying the output signals with the corresponding test signals applied to the first set of internal lines, 4. The test method of claim 1 wherein the at least one component is at least one memory chip and the circuit carrier is a memory module.

5. The test method of claim 4 wherein the first set of internal lines comprise data lines or bit lines associated with a word line.

6. The test method of claim 5 wherein the memory module is coupled to the external memory test apparatus which is operable to actuate the internal test signal generator, obtain the output signals, and evaluate the output signals.

7. The test method of claim 6 wherein applying the test signals includes writing prescribed test data to the memory chip, wherein before the output signals are obtained the test signal generator is deactivated, and wherein the memory test apparatus reads the written test data and determines the connection configuration by comparing the read test data with the prescribed test data.

8. The test method according to claim 7 wherein the method steps are repeated cyclically with different test data, each test cycle involving a first logic level being applied to one of the internal lines and a second logic level being applied to the remaining internal lines in order to associate one of the respective external circuit carrier connections with each internal line.

9. The test method according to claim 1 wherein the test signal generator is an ACTM test pattern generator which can be programmed using a second set of internal lines.

10. A memory module test system comprising:
  a) a memory module including external memory module connections, the external memory module connections comprising memory module data connections and memory module control connections;
  b) at least one memory chip arranged on the memory module, the memory chip including internal data lines connected to memory chip data connections and internal control lines connected to memory chip control connections, wherein the memory chip includes an integrated controllable test signal generator operable to apply test signals to the internal data lines, the test signal generator further operable to accept control signals from and output control signals to the internal control lines, the memory chip data connections being connected to the memory module data connections and the memory chip control connections being connected to memory module control connections; and
  c) an external memory test apparatus connected to the external memory module connections, the external memory test apparatus operable to apply control signals to the memory module control connections and operable to receive output signals from the memory module data connections;
  d) wherein in a first test phase the external memory test apparatus is operable to provide to the memory module control connections control signals operable to activate the test signal generator;
  e) wherein in a second test phase the internal test signal generator is operable to provide to the internal data lines of the memory chip prescribed test data signals in order to write test data to the memory chip, and wherein the external memory test apparatus is operable to provide to the memory module control connections control signals operable to deactivate the test signal generator; and
  f) wherein in a third test phase the external memory test apparatus is operable to read the written test data as output signals at the memory module data connections and compare the read test data with the written test data in order to ascertain the connection configuration between the memory chip data connections and the memory module data connections.

11. The memory module test system of claim 10, wherein the prescribed test data signals are stipulated by programming the test signal generator when the memory chip is produced.

12. The memory module test system of claim 11 wherein the test data signals are prescribed such that a data item on one of the internal data lines describes a first logic state and the data on the remaining internal data lines describe a second logic state.

13. The memory module test system of claim 10 wherein in a fourth test phase the external memory test apparatus performs a memory test on a memory cell array in the memory chip taking into account the ascertained connection configuration between the memory chip data connections and the memory module data connections.

14. A memory module test system including a memory module having at least one memory chip arranged on the memory module, the memory chip including internal lines connected to memory chip connections in a prescribed order, and the memory module including external memory module connections connected to the memory chip connections, the memory module test system comprising:

(a) means for applying prescribed test signals to the internal lines of the memory chip, said means for applying integrated in the memory chip;

(b) means for obtaining output signals from the external memory module connections; and (c) means for determining a mapping between the memory chip connections and the external memory module connections, said means for determining operable to identify the respective output signals from the external memory module connections with the corresponding test signals applied to the internal lines of the memory chip.

15. The memory module test system of claim 14 wherein the prescribed test signals are prescribed by programming the means for applying when the means for applying is produced.

16. The memory module test system of claim 14 wherein the test signals are prescribed such that a data item on one of the internal lines describes a first logic state and the data on the remaining internal lines describe a second logic state.

17. The memory module test system of claim 14 wherein the internal lines in the memory chip comprise a first set of internal lines and wherein the at least one memory chip further includes a second set of internal lines, wherein the memory chip connections comprise a first set of memory connections and wherein the at least one memory chip further includes a second set of memory connections, the first set of internal lines connected to the first set of memory connections and the second set of internal lines connected to the second set of memory connections.

18. The memory module test system of claim 17 wherein the external memory module connections comprise a first set of external memory module connections and wherein the memory module further comprises a second set of external memory module connections, the first set of memory chip connections connected to the first set of external memory module connections and the second set of memory chip connections connected to the second set of external memory module connections.

* * * * *